United States Patent [19]

Vis

[11] 3,963,981

[45] June 15, 1976

[54] LEAKAGE AND CONTINUITY TESTER

[75] Inventor: Vincent A. Vis, Brighton, Mich.

[73] Assignee: J. M. Richards Laboratories, Grosse Points Park, Mich.

[22] Filed: Oct. 9, 1974

[21] Appl. No.: 513,222

[52] U.S. Cl. .................................. 324/51; 324/62
[51] Int. Cl.² ........................................ G01R 31/02
[58] Field of Search ........................... 324/51, 62, 1; 317/18 A, 18 B; 340/255

[56] References Cited
UNITED STATES PATENTS

| | | | |
|---|---|---|---|
| 3,697,808 | 10/1972 | Lee | 317/18 B X |
| 3,700,966 | 10/1972 | Morrow | 340/255 X |
| 3,784,842 | 1/1974 | Kremer | 317/18 A X |

Primary Examiner—James B. Mullins
Attorney, Agent, or Firm—Harness, Dickey & Pierce

[57] ABSTRACT

A leakage and continuity test unit for checking the ground impedance and leakage current in a medical instrument to ensure that the medical instrument is properly grounded and does not conduct an excessive amount of leakage current through the chassis. The unit includes a test probe which is interconnected with the equipment under test, the unit including a continuity circuit having a comparator which compares a fixed voltage with a voltage representative of the impedance to ground of the equipment under test. The output of the comparator is fed to a flip flop circuit which, when an excessive amount of ground impedance exists, drives a warning lamp circuit. If the impedance is below certain set limits, the flip flop will drive a lamp which indicates that the ground of the equipment under test is proper. The unit also includes a leakage detector circuit which includes an upper and lower limit control circuit which establishes different standards for the equipment under test depending on whether the equipment is to be used in critical service or general service areas within the hospital. The leakage signal is fed through a precision rectifier which in turn feeds the signal to a dual input comparator which dual input comparator is capable of testing either a positive or negative signal. The output of the comparator is fed to a flip flop circuit which drives a set of lamps, one of which warns the user that an excess of leakage current exists and the other of which indicates to the user that the leakage current is within the limit set by the gain control circuit.

19 Claims, 4 Drawing Figures

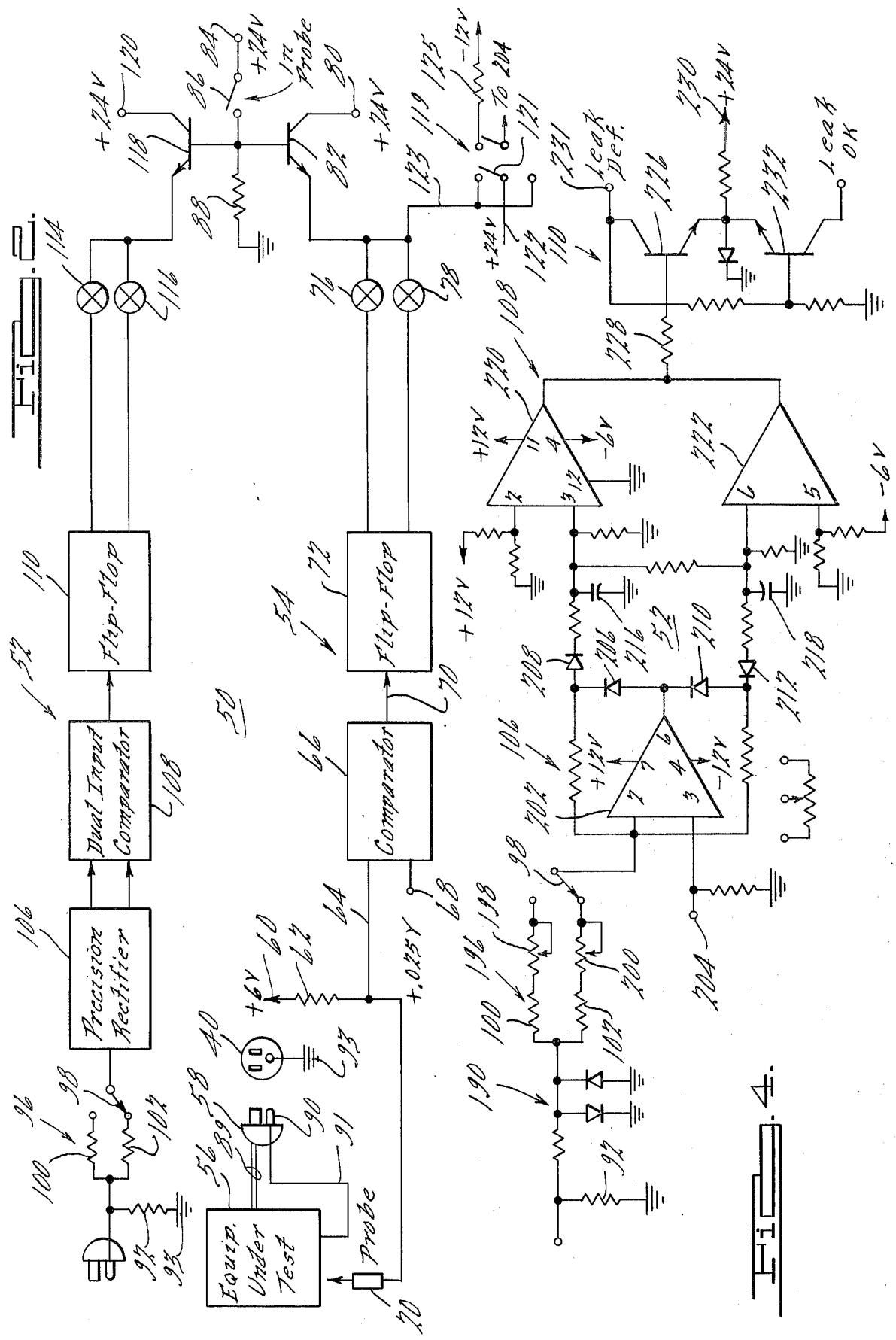

LEAKAGE AND CONTINUITY TESTER

BACKGROUND AND SUMMARY OF THE DISCLOSURE

This invention relates generally to a medical instrument test unit and more particularly to a test unit which is adapted to check the ground continuity and leakage current of a medical instrument, the leakage current portion of the system being adapted to check the unit under selectable standards.

In modern hospitals, the treatment, care, and monitoring of patients is accompanied by a widespread use of electrical equipment. In the use of this equipment, many hazards may arise such as the shocking of certain patients which are hypersensitive to electrical shock. This is particularly acute in the case of cardiac patients wherein electrical equipment is in the greatest use. Further, the use of certain gasses in operating rooms and the like have created an explosion hazard, which explosion could be caused by the discharge of a piece of equipment having a different potential than, for example, an adjacent piece of equipment with which it may come into contact. Thus, a necessity has arisen for providing test equipment to ensure that the continuity and leakage characteristics of the medical equipment is within manufacturing standards.

Many types of test equipment have been marketed to test various types of monitoring equipment. For the most part, this equipment has involved the use of meters and the like to indicate to the user whether the equipment under test is within manufacturing standards as far as leakage current and ground continuity is concerned. Further, while the use of indicating meters provides the user with an accurate reading of the leakage current and ground continuity condition of the equipment under test, it has necessitated the education of the user personnel to the peculiarities of the equipment under test insofar as limits of acceptable continuity and leakage current are concerned. Accordingly, it has been found desirable to provide test equipment which is of the go - no go type wherein lamps are illuminated in accordance with the conditions of whether the equipment is within standards or not. Further, it has been desirable to provide variable standards whereby the same lamps will be utilized to indicate a go or no go condition in accordance with the standards which the user has set into the test equipment.

The system of the present invention is particularly adapted to provide an indication of the acceptable condition of the equipment under test insofar as ground continuity and leakage current is concerned. Further, the equipment of the present invention provides a simple method for testing the test unit itself to ensure that it is operating properly. As a further consideration, the unit of the present invention includes a simple switch which varies the standards under which the leakage current is tested to vary the test depending upon whether the equipment is to be used in a critical service area within the hospital, for example in the intensive care area, or whether the equipment is to be used generally throughout the hospital and not in the intensive care area. Further, the unit includes a simple test switch which is adapted to test the operability of the leakage circuit to determine if it is operating properly and test points on the exterior of the cabinet are provided to verify the correct operation of the continuity circuit.

Referring to the general details of the system, the test equipment is plugged into a suitable source of alternating current potential and permitted to warm-up for a preselected period of time. The equipment under test is then plugged into a socket provided on the test equipment to establish a circuit between the test equipment and the equipment under test. The test equipment includes a circuit for testing the continuity of the ground circuit of the equipment under test wherein a probe connected to the continuity circuit is pressed against the metallic frame or chassis of the equipment under test. This establishes a circuit whereby the impedance of the equipment under test is compared to a fixed impedance by means of a comparator circuit. If the ground impedance of the equipment under test exceeds a certain limit, a flip flop circuit is set to drive a red warning lamp. If the ground impedance is within the set limit, the flip flop circuit will drive a green lamp to indicate that the impedance is within limits. Further, the test equipment includes a leakage detector circuit which is connected in circuit with the equipment under test. Alternating current is fed to the equipment under test through the a.c. prongs of the plug 58 (FIG. 2) when mated with the corresponding female portion of socket 40 which is supplied alternating current from the source supplying energy to the test unit. If a fault occurs, the leakage current flows through a resistor connected in the input circuit of the leakage detector circuit. This current flowing through the resistor will establish a voltage which is fed to a precision rectifier through a variable limit gain control switch which establishes whether the equipment is to be tested against a critical standard or a general standard. The output of this gain control circuit is fed through the precision rectifier to the input of a dual input comparator circuit which is capable of sensing either positive or negative leakage currents. If the system is within limits, as established by the gain control circuit, the flip flop circuit will drive a green lamp which indicates that the system is within acceptable limits. If the leakage current exceeds the set standard, the flip flop circuit will drive a red warning lamp. In this way the operator is warned that the leakage current through the equipment is excessive for the particular use to be made of the equipment.

The system also includes a means for testing the operation of the circuit whereby preslected impedances are connected to the input circuit of the continuity checking circuit, one impedance causing the energization of the green lamp and the other impedance causing the energization of the red lamp, the two impedances establishing the range for the go and no-go conditions.

The leakage current detector is checked by means of a test switch mounted on the face plate or panel of the unit cabinet, the switch being a center position, toggle-type switch. When the switch is thrown in one direction, a source of potential is connected to an input of the leakage detector circuit to upset the balance of the circuit such that the dual input comparator will provide an output signal indicating that the leakage is excessive. This will cause the red warning lamp to be illuminated. On the other hand, when the switch is thrown to the opposite position, a ground potential is fed to the input circuit of the precision rectifier to upset the signal levels on the dual comparator to illuminate the green indicator lamp.

Accordingly, it is one object of the present invention to provide an improved continuity and leakage test apparatus.

It is another object of the present invention to provide an improved test apparatus for checking the leakage current and ground continuity of medical instrumentation.

It is a further object of the present invention to provide an improved continuity test circuit for use in conjunction with testing the ground continuity of medical equipment.

It is another object of the present invention to provide an improved leakage test circuit for use in conjunction with testing the amount of leakage current flowing in a medical instrument.

It is still another object of the present invention to provide an improved test unit of the type described above which has improved self-checking characteristics.

It is still another object of the present invention to provide an improved test apparatus such as the type described above which provides a means for varying the limits of the leakage test circuit.

Further objects, features and advantages of the present invention will become apparent upon reading the description and claims, and upon studying the accompanying drawings in which:

FIG. 2 is a block diagram illustrating the general details of the circuit contained within the unit of FIG. 1;

FIG. 4 is a schematic diagram illustrating the particular details of a preferred form of leakage test circuit for use in conjunction with the present invention.

Figure 1:
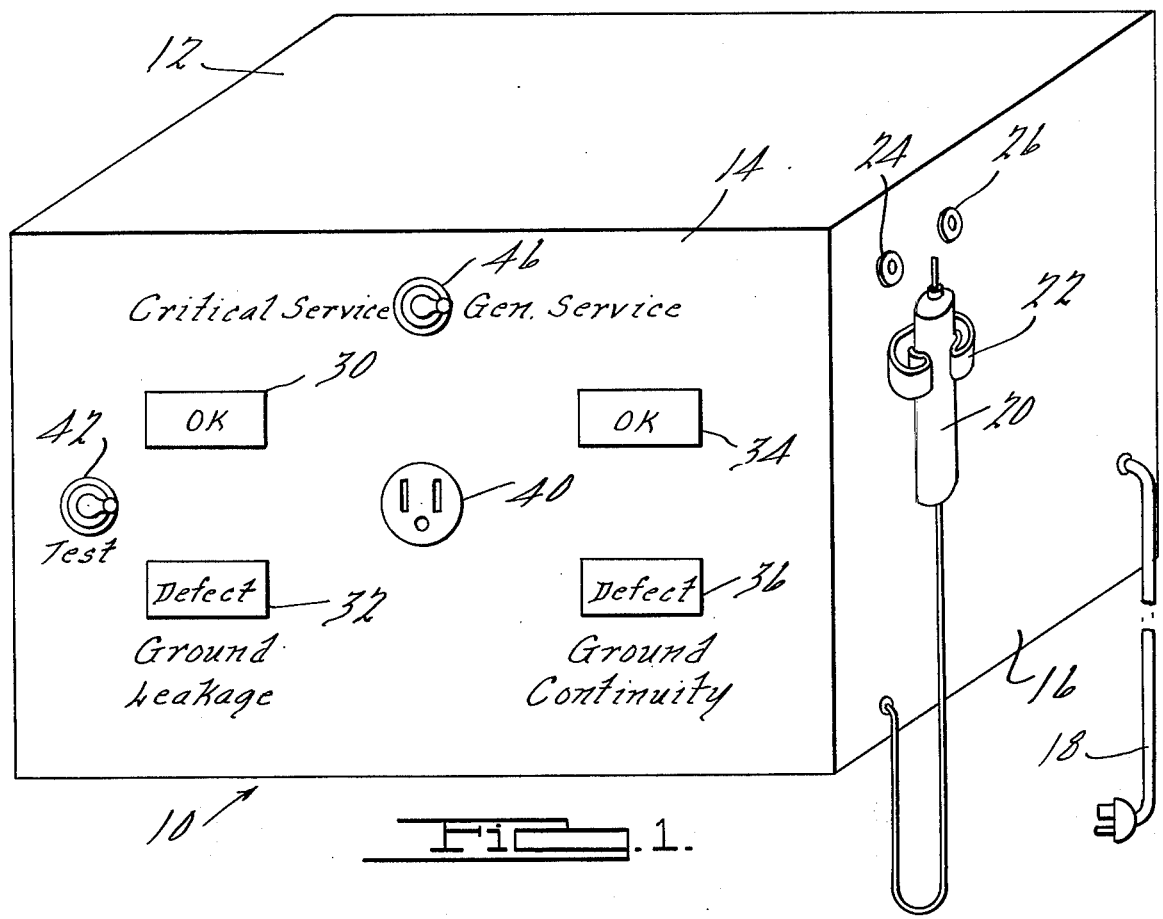
FIG. 1 is a perspective view of a test unit incorporating the features of the present invention.

Referring now to FIG. 1, there is illustrated a perspective view of a unit 10 incorporating the features of the present invention. Specifically, the unit 10 includes a housing 12 which encloses electrical components of the unit, the housing 12 having a face plate 14 which is adapted to mount the various lamps, switches and plugs illustrated. The side 16 of the unit supports a cord 18 which is adapted to be inserted into a convenience outlet to supply electrical energy to the unit. The side 16 also includes a mounting mechanism for a probe 20, the probe 20 being held by means of a clamp member 22 attached to the side 16. As will be seen from a further description of the details of the circuitry, the side 16 also mounts a first probe aperture 24 and a second probe aperture 26 which is utilized in testing the unit. The apertures 24, 26 are provided with a terminal and resistor for each aperture, the resistors being connected between the corresponding terminal and ground.

The front of the unit includes two sets of lamp assemblies, the first of which is associated with the ground leakage circuit and includes a lens 30 which, when illuminated, indicates that the ground leakage is within acceptable limits and a second lens 32 which, when illuminated, indicates that the ground leakage is not within acceptable limits. The right side of the unit supports the second set of lamp assemblies which is associated with the ground continuity circuit and includes a first lens 34, the illumination of which indicates that the ground continuity circuit is within limits, and a lens 36 which, when illuminated, indicates that the ground continuity is defective.

The face 14 is provided with a female convenience outlet 40 into which is inserted the power supply plug of the equipment under test. This plug 40 is utilized to interconnect the equipment under test with the circuitry of the test unit, as will be seen from a further description of the invention. Further, the ground leakage circuit is tested by means of a center position toggle switch 42 which, when actuated, tests the ground leakage circuit. This test is done with nothing plugged into the socket 40. For example, if the test switch 42 is moved to the up position, the lens 30 will be illuminated and if it is moved to the down position, the lens 32 will be illuminated. This provides the user with an indication of whether the circuit is defective or not.

Further, the unit includes a critical service-general service toggle switch 46, which switch changes the sensitivity of the ground leakage circuit to establish different standards of acceptability depending on whether the equipment under test is to be used in a critical service area or if the equipment under test is to be used in a general service area. The switch 46 is indicated to be in the general service position, but may be thrown to the left to change the circuitry to establish limits for the ground leakage for the critical service test.

Referring now to FIG. 2, there is illustrated a block diagram of the system of the present invention. Specifically, the circuit 50 includes a leakage current detector circuit 52 and a ground continuity detector circuit 54. The equipment under test unit 56 includes an alternating current plug 58 which is adapted to be inserted into the plug 40 described in conjunction with FIG. 1. This establishes a circuit which includes the equipment under test and the test unit.

Referring now to the ground continuity circuit 54, the system includes the probe 20, the handle of which has an on-off switch, to be described hereinafter, which is actuated in response to the pressing of the end of the probe into the handle 20. The probe 20 is pressed against the chassis 56 of the equipment under test whereby a voltage is established between the probe 20 and ground in response to the ground continuity of the equipment under test. Accordingly, if the ground continuity includes a large impedance, a large voltage will be developed at the probe 20. This voltage is derived from the source of 6-volt potential at input terminal 60, which 6-volt potential is fed to the probe 20 through a resistor 62. The voltage developed across the ground impedance for the equipment under test is fed to an input conductor 64, the input conductor being connected to a comparator circuit 66. The comparator circuit includes a standard input of 0.025 volts which is impressed at input terminal 68. This provides the second input to the comparator 66.

If the comparator 66 detects that the voltage at conductor 64 is greater than the preset voltage at terminal 68, an output signal is provided on a conductor 70, which output signal is fed to a flip flop circuit 72. The set or reset condition of the flip flop circuit 72 is determined by the signal derived from the comparator circuit on conductor 70.

The set or reset condition of the flip flop circuit 72 is fed to drive a pair of lamps 76, 78, the lamp 76 indicating the okay condition of the ground circuit of the equipment under test and the lamp 78 indicating the defective condition of the equipment under test. The current flowing through the lamps 76, 78 is supplied from a voltage at input terminal 80, which voltage is fed to the lamps 76, 78 through an NPN transistor 82. The conductive condition of the transistor 82 is controlled by means of a base-bias circuit including a source of 24-volt potential at input terminal 84, an on-off switch 86 and a resistor 88 connected to ground. The switch 86 is the switch mounted in the probe 20 described above, the switch 86 being closed in response to pressure against the end of the probe. With the switch 86 closed, the transistor 82 is rendered conductive to supply energy to the lamps 76, 78. However, the lamps 76, 78 will not be liminated except in response to the condition of the flip-flop circuit 72.

Figure 3:
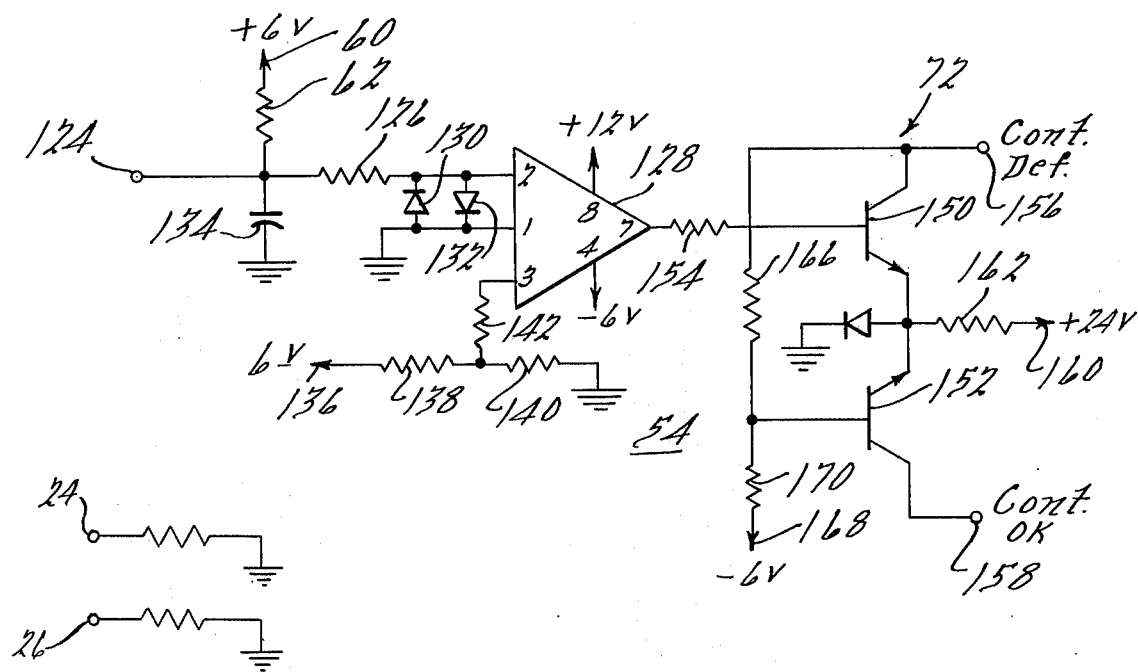
FIG. 3 is a schematic diagram illustrating the particular details of the preferred form of ground continuity test circuit.

In order to test the ground continuity circuit 54, the probe 20 is inserted into either aperture 24 or aperture 26 (FIG. 1), the interior of each of which is provided with an impedance connected to ground (see lower left portion of FIG. 3). The impedance corresponding to aperture 24 is provided with an impedance having a value which is slightly less than the critical impedance set into the circuit which determines if the ground circuit is defective. On the other hand, the impedance associated with aperture 26 is slightly greater than the critical ground impedance. Thus, with the probe inserted into aperture 24, the assembly lamp 34 should be illuminated and, with the probe inserted into aperture 26, the lamp assembly 36 should be illuminated.

Referring now to the leakage detector circuit 52, the equipment under test provides any leakage current from an alternating source connected to the alternating current prongs of plug 58, which current flows through conductors 89, the interior circuitry of unit 56, through any faulty insulation through the chassis or frame to the ground wire 91. This provides a connection to common ground 93 from the equipment under test. This ground connection supplies energy to an input resistor 92 connected at the input circuit of the leakage detector circuit 52. This leakage current, depending on the magnitude thereof, develops a voltage across the resistor 92, which voltage is fed to a gain control circuit 96. The gain control circuit includes a switch element 98 and a pair of resistors 100, 102. The resistors 100, 102 may be made variable to adjust the set points and are used to select the sensitivity of the leakage circuit such that the system can be transferred from a critical to a general service test as described in conjunction with the switch 46 in FIG. 1. For example, if the switch is in the position illustrated, the resistor 102 will establish general service standards for the leakage detector circuit 52. If the switch is moved to the upper position, the circuit will establish standards for the critical service operation.

The output of the gain control circuit is fed to a precision rectifier circuit 106, which precision rectifier circuit is utilized to sense positive and negative polarity signals from the resistor 92. Thus, the system can detect either the positive or negative leakage current signals. The output of the precision rectifier is fed to a dual input comparator circuit 108, which comparator circuit 108 detects the level of leakage current, irrespective of whether the leakage current is in the positive or negative direction. The output of the comparator is fed to a flip flop 110, the set or reset condition of the flip flop being determined by the signal from the comparator which indicates whether the leakage current is excessive or not excessive. The flip flop 110 provides a control signal for controlling the illumination of an okay lamp 114 or a defect lamp 116. The okay lamp indicates that the leakage current is within the acceptable limits set by the gain control circuit 96 and the defect lamp 116 indicates that the leakage current is excessive and the equipment is defective. The lamps are supplied electrical energy from an NPN transistor 118 and a power supply 120, the transistor being rendered conductive by means of the base by a circuit described in conjunction with the description of the transistor 82. With regard to the probe switch 86, the circuit configuration illustrated is used to ensure that the probe switch 86 makes the breaks a relatively low current, the base-bias current for transistors 82, 118, rather than the high current being passed through the collector-emitter circuits of transistors 82, 118.

At operation, the plug 90 is inserted into the socket 40 and the probe 20 is pressed against the metallic frame or chassis of the equipment under test with sufficient force to actuate the on-off switch 86 within the probe 20. This establishes the voltage at the input of the comparator circuit 66 which compares that voltage with the voltage at terminal 68. In this way, the proper lamp 76 or 78 will be illuminated.

On the other hand, insertion of the plug 90 into the socket 40 develops a leakage current signal across the resistor 92, which signal is modified by means of either the resistor 100 or resistor 102, depending on whether the equipment under test is to be used in the critical service area or the general service area. The signal is then rectified by precision rectifier 106 to develop either a positive or negative signal, which positive or negative signal is fed to the input comparator 108. The comparator 108 controls the flip flop 110 which in turn controls the energization of the lamps 114, 116. In this way, the lamp 114 is illuminated if the leakage current is within limits and the lamp 116 is illuminated if the leakage current is without limits and the equipment is defective.

In order to test the leakage circuit 52, a test switch 119 has been provided which simulates the closure of switch 86 and provides an input to terminal 204 depending on whether the okay or defect conditions are to be checked. The circuit is actuated by the test switch 42 described in conjunction with FIG. 1 wherein a center-off, double throw switch 121 is connected to the toggle shown in FIG. 1. In order to check the defect portion, the switch is moved up such that the 24-volt supply at 122 is connected to the lamps 76, 78 through conductor 123. Also, the −12 volt supply is connected to terminal 204, through an impedance 125. This arrangement will energize the defect portion. If the switch 121 is moved down, the lamps 76, 78 will still be connected to the 24-volt supply at conductor 122, but the terminal 204 will be open circuited. In this way, the okay circuit is energized.

Referring now to FIG. 3, there is illustrated the specific details of the ground continuity checking circuit 54. Specifically, the probe 20 is connected to an input terminal 124 to provide the input signal to the circuit 54. As was described in conjunction with the description of FIG. 2, the resistor 62 provides current to the probe circuit connected to the terminal 124 from the 6-volt supply at terminal 60. This signal is fed through a resistor 126 and then to the input of a comparator circuit 128 which is of the integrated circuit type. Suitable diodes 130, 132 have been provided to ensure that the circuit 128 is protected from voltage surges. Also, a filter capacitor 134 filters the input signal. The comparator 128 is provided with a second fixed input signal from a power supply at terminal 136 through a pair of voltage divider resistors 138, 140, the signal being fed to the input circuit of the comparator 128 though a resistor 142. Thus, the ground signal from terminal 124 is compared to the signal being fed to the input circuit of the comparator 128 from the resistor 142. If the signal at terminal 124 is excessive, an output signal is provided to the flip flop circuit 72, the flip flop circuit including a first NPN transistor 150 and a second NPN transistor 152. The output of the comparator 128 is fed directly to the base of the transistor 150 by means of a resistor 154.

The continuity lamps 76, 78 (FIG. 2) are connected to a pair of terminals 156,158, the continuity defective lamp being connected to terminal 156 and the continuity okay lamp being connected to terminal 158. The transistors 150,152 are supplied a positive bias from a source of 24-volt supply at terminal 160 through a resistor 162, the base electrode of the transistor 152 being connected to the emitter electrode of the transistor 150 by means of a resistor 166. The base electrode of transistor 152 is connected to a negative source of potential at terminal 168 through a resistor 170. In the event that the circuit indicates that the continuity is defective, this output signal from comparator 128 will cause transistor 150 to be turned on. This will cause current to flow through the continuity defective lamps and through the transistor 150. However, this draws the voltage of the base electrode of the transistor 152 very near to the voltage of its emitter electrode due to the conduction of transistor 150. This will cause the transistor 152 to cease conduction. On the other hand, if the signal at the output of comparator 128 indicates that the continuity is within limits, transistor 150 will not be turned on and the transistor 152 will conduct due to the fact that the base electrode is tied to a positive potential at terminal 156. This will cause transistor 152 to conduct to illuminate the continuity okay lamps connected to the terminal 158.

Referring now to FIG. 4, there is illustrated the specific details of the leakage detector circuit. As stated above in connection with the description of FIG. 2, a signal is developed across the resistor 92 which is indicative of the leakage current flowing through the chassis of the equipment under test. This signal is fed through a resistor-diode circuit 190 and then to the gain control circuit 196. In a preferred embodiment, the gain control circuit has been slightly modified from the described in conjunction with FIG. 2 in that a variable resistor potentiometer 198 and a second potentiometer 200 have been connected in the circuit to provide the user with the capability of varying the impedance inserted into the circuit. With the switch 98 properly set, the signal from the gain control circuit 196 is fed to the precision rectifier 106 which includes an operational amplifier 202, the upper input of which is fed from the switch 98. The lower input includes a test terminal 204 to a source of negative potential for testing, as will be more fully explained hereinafter.

The operational amplifier 202 is connected as a precision rectifier, the output of which is fed through a pair of diode circuits, the first circuit including diodes 206, 208, and the second circuit including diodes 210, 212. If the signal from switch 98 is of a negative polarity, the current will flow from the operational amplifier 202, though the diodes 206, 208 to charge a capacitor 216. If the signal is of the positive polarity, current will flow through diodes 210, 212 to charge a capacitor 218.

The capacitors 216, 218 are connected to the input circuit of the dual input comparator circuit 108 which includes a pair of operational amplifiers 220, 222. The upper operational amplifier 220 is responsive to the positive signal on capacitor 216 and the operational amplifier 222 is responsive to the negative signal on capacitor 218. If either the positive or negative signal is outside of the limits set by the gain control circuit 196, one or the other of the amplifiers 220, 222 will cause the flip flop circuit 110 to be operational. It is to be noted that the circuit 110 is identical in structure and operation to that described in conjunction with circuit 72 described in FIG. 3.

Specifically, a transistor 226 is directly connected to the output of the amplifiers 220, 222 by means of a resistor 228. The amplifiers 220, 222 compare the input signal from capacitors 216, 218 to the other input to the amplifiers 220, 222. The other input is, of course, a fixed input which sets the signal level for the comparison which is made by the amplifiers 220, 222. In the event that the leakage signal is found to be too high to indicate the unit is defective, the transistor 226 will become conductive to energize the leakage defective lamps. On the other hand, if no signal appears through resistor 228, the leakage okay transistor 232 will conduct due to the fact that the base electrode is grounded in this case, whereas the base electrode of transistor 152 is connected to a positive potential at terminal 231. In any event, the transistor 232 will conduct when the transistor 226 is non-conductive. This will cause the leakage okay lamp to be illuminated to indicate the leakage current is within limits.

While it will be apparent that the preferred embodiment of the invention disclosed is well calculated to fulfill the objects above stated, it will be appreciated that the invention is susceptible to modification, variation and change without departing from the proper scope or fair meaning of the sub-joined claims.

What is claimed is:

1. A test unit for testing the ground continuity and leakage characteristics of an electrical unit under test having a ground circuit and a chassis comprising a housing, means mounted on said housing adapted to be connected to the ground circuit of the unit under test, means adapted to be connected to the chassis, ground continuity test circuit means connected to said chassis connection means including a power supply and a conductor connected to said chassis for supplying electrical current though said chassis to said ground circuit to establish an electrical potential signal across the impedance of said ground circuit, said continuity test circuit means including comparator circuit means including an input signal from said chassis connection means and a fixed input signal, a go-no go type ground output indicator circuit including digital output means to indicate the acceptable or defective condition of said ground circuit as determined by said comparator circuit, and leakage current test means including input circuit means connected to the leakage current circuit under test including dual comparator means for comparing positive and negative polarity leakage signals with a standard signal, said input circuit means including an operational amplifier connected as a precision rectifier to sense positive and negative polarity input signals, and go-no go leakage output indicator circuit including digital output means to indicate the acceptable or defective condition of said leakage circuit as determined by said dual comparator circuit.

2. The improvement of claim 1 further including bi-stable circuit means connected between said comparator circuit and said ground output indicator circuit, said bi-stable circuit means having first and second stable states.

3. The improvement of claim 2 wherein said bi-stable circuit is in said first state in response to the input signal from said chassis being less than said fixed input signal and said second state in response to said input signal exceeding said fixed input signal.

4. The improvement of claim 3 further including a second bi-stable circuit connected between said dual input comparator circuit and said leakage output indicator circuit.

5. The improvement of claim 4 wherein said second bi-stable circuit has two stable states, said bi-stable circuit being in a first state in response to said leakage signal being less than said standard signal and being in a second state in response to said leakage signal exceeding said standard signal.

6. The improvement of claim 5 further including an a.c. power supply and wherein said a.c. power supply establishes a current flow through said chassis and at least a portion of said leakage current input circuit means.

7. The improvement of claim 6 wherein said means mounted on said housing is also connected to ground thereby connecting the ground circuit of the unit under test to a common ground with said test unit.

8. The improvement of claim 7 wherein said input circuit means includes impedance means connected between a common ground and said dual comparator means.

9. The improvement of claim 8 further including bias control circuit means connected between said impedance means and said dual comparator means for selectively varying said positive and negative polarity leakage signals in accordance with a variation in acceptable leakage currents for said unit under test.

10. The improvement of claim 9 wherein said go and no-go output indicator circuits include at least one lamp for each go circuit and at least on lamp for each no-go circuit, said go lamp being illuminated in response to said bi-stable circuit being in said first state and said no-go lamp being illuminated in response to said bi-stable circuit being in said second state.

11. The improvement of claim 10 wherein said dual comparator circuit means includes a first operational amplifier and a second operational amplifier, each of said amplifiers receiving one polarity leakage signal from said input circuit.

12. The improvement of claim 11 wherein said input rectifier circuit means includes a first input connected to said control bias circuit, said rectifier circuit including first and second storage means connected to the output of said operational amplifier for storing opposite polarity signal levels.

13. The improvement of claim 12 further including test circuit means connected to another input from said rectifier circuit operational amplifier including a test switch, said test switch being adapted to connect a signal level to said another input circuit for testing said go and no-go lamps.

14. The improvement of claim 13 wherein said test switch is a three-position center biased switch, movement of said switch from one direction off center illuminating said go lamp and moving said test switch in the opposite direction off center illuminating said no-go lamp.

15. The improvement of claim 14 further including ground continuity test circuit means including first and second impedance means, said chassis connecting means including a probe connected between the continuity test circuit means comparator circuit means and said chassis, said probe adapted to be selectively connected to said first and second impedance means, said first impedance means establishing a signal level for said comparator circuit means to illuminate said go lamp and said secod impedance means establishing a signal level to illuminate said no-go lamp.

16. The improvement of claim 1 further including an a.c. power supply and wherein said a.c. power supply establishes a current flow through said chassis, and at least a portion of said leakage current input circuit means.

17. The improvement of claim 16 wherein said means mounted on said housing is also connected to ground thereby connecting the ground circuit of the unit under test to a common ground with said test unit.

18. The improvement of claim 17 wherein said input circuit means includes impedance means connected between a common ground and said dual comparator means.

19. The improvement of claim 18 further including bias control circuit means connected between said impedance means and said dual comparator means for selectively varying said positive and negative polarity leakage signals in accordance with a variation in acceptable leakage current for said unit under test.

* * * * *